United States Patent
Dietrich et al.

(10) Patent No.: US 7,178,073 B2
(45) Date of Patent: Feb. 13, 2007

(54) TEST METHOD AND TEST APPARATUS FOR AN ELECTRONIC MODULE

(75) Inventors: Stefan Dietrich, Türkenfeld (DE); Matthias Grewe, München (DE); Peter Mayer, München (DE); Armin Rettenberger, München (DE)

(73) Assignee: Infineon Technologies AG, Munich (DE)

( * ) Notice: Subject to any disclaimer, the term of this patent is extended or adjusted under 35 U.S.C. 154(b) by 661 days.

(21) Appl. No.: 10/389,580

(22) Filed: Mar. 14, 2003

(65) Prior Publication Data

US 2003/0177418 A1    Sep. 18, 2003

(30) Foreign Application Priority Data

Mar. 14, 2002  (DE) ................ 102 11 136

(51) Int. Cl.
*G01C 29/00*     (2006.01)
*G11C 20/00*     (2006.01)

(52) U.S. Cl. .............. 714/719; 714/718; 365/201
(58) Field of Classification Search ............. None
See application file for complete search history.

(56) References Cited

U.S. PATENT DOCUMENTS

| | | | | |
|---|---|---|---|---|
| 4,075,665 A | * | 2/1978 | Borne et al. .......... 360/8 |
| 4,414,665 A | * | 11/1983 | Kimura et al. ........ 714/719 |
| 4,562,488 A | * | 12/1985 | Koyama et al. ........ 360/8 |
| 5,091,884 A | * | 2/1992 | Kagami .............. 365/200 |
| 5,267,206 A | * | 11/1993 | Koyabu .............. 365/201 |
| 2002/0012286 A1 | | 1/2002 | Ernst et al. | |

FOREIGN PATENT DOCUMENTS

DE    100 34 897 A1    1/2002

\* cited by examiner

*Primary Examiner*—Phung My Chung
(74) *Attorney, Agent, or Firm*—Laurence A. Greenberg; Werner H. Stemer; Ralph E. Locher

(57) ABSTRACT

A method for testing an electronic module having a memory cell device includes writing an information item to the memory cell device at a first clock frequency and then reading-out the information item from the memory cell device at a second clock frequency. The read out information item is reflected at a reflection point and is written back to the memory cell device at the second clock frequency. The reflected information unit is then read-out from the memory cell device with the first clock frequency.

20 Claims, 4 Drawing Sheets

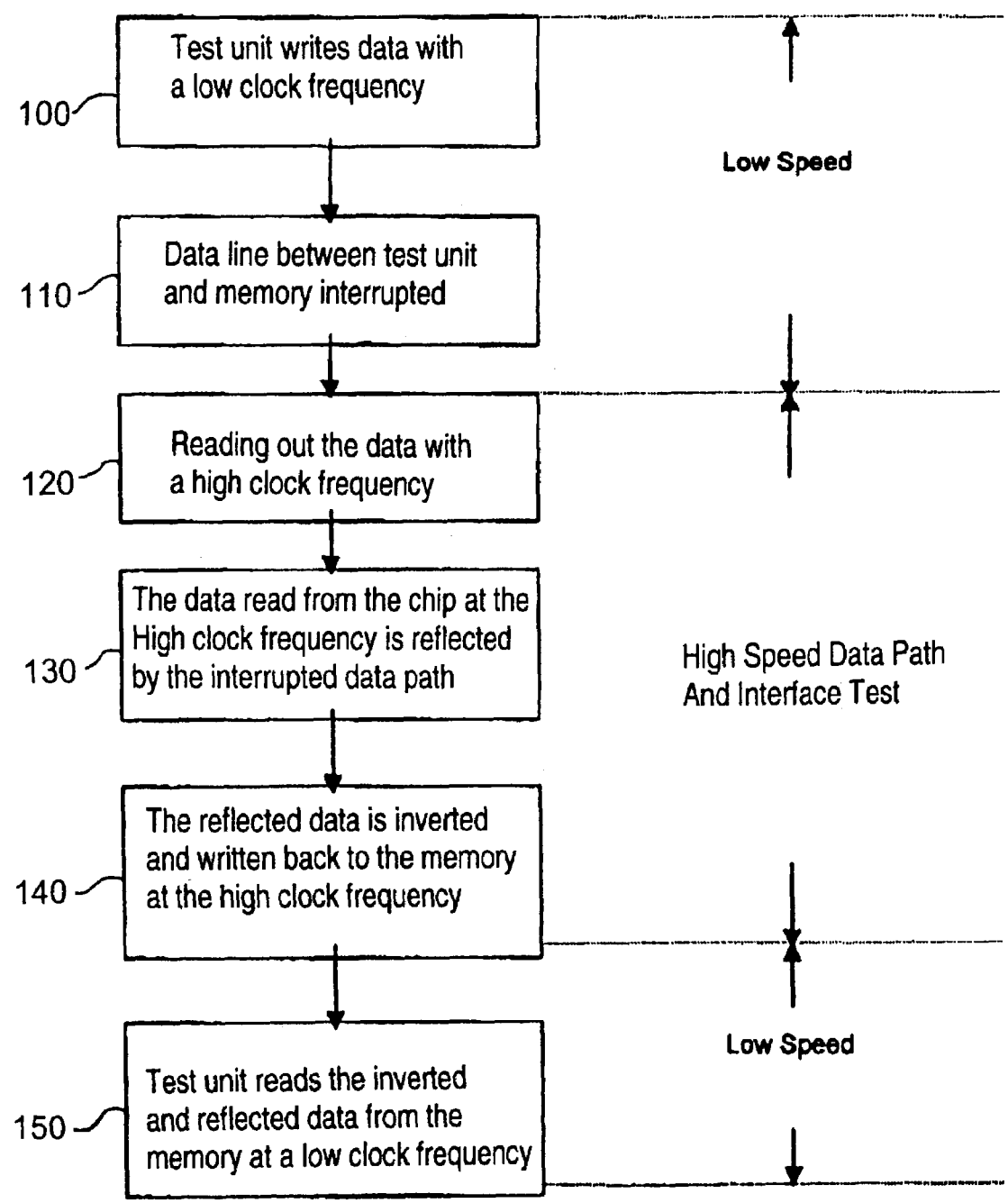

TEST METHOD AND TEST APPARATUS FOR AN ELECTRONIC MODULE

BACKGROUND OF THE INVENTION

Field of the Invention

The invention relates to a test method for the characterization of electronic modules having memory cells, in particular DRAM memory modules, and to a test apparatus for carrying out the test method.

The production phase of electronic modules contains a multiplicity of functional tests of the electronic circuits produced. Such functional tests are employed both in quality assurance and in production monitoring of the electronic modules. It is often the case that, when a functional test is failed, the properties of an electronic module defined by the specification can be ensured by activating special redundancy elements. As a result of this, it is possible to significantly improve the yield (yield rate), which is defined as the ratio of the number of electronic modules produced overall to the number of intact electronic modules.

In the case of electronic modules having a multiplicity of memory cells, such as e.g. memory modules, writing and reading tests carried out under realistic conditions, in particular, are among the most important functional tests of this type. However, the maximum speed of the tester hardware used often forms a critical aspect here. Modern memory modules, such as e.g. DRAM memory modules, operate at very high speeds (clock frequencies), e.g. graphics memories in the mean time having achieved clock frequencies of up to 300 MHz. Moreover, memory modules now operate using the double-data-rate method, which method allows a double data rate compared with conventional methods since data units are in this case clocked on rising and falling edges of the clock signal. This results in data rates of up to 600 Mbits/sec.

The requirements imposed on testers used are enormously high on account of these high data rates. In order to carry out a meaningful test of a memory module, a tester has to sample the received data signals of a memory module at a rate that is at least twice as high, in accordance with the sampling theorem. This requires particularly powerful tester hardware. Therefore, the high-speed testers that are currently used for writing/reading tests of DRAM memory modules make an ever greater impression on the production costs.

Despite the high hardware expenditure, the high-speed testers that are currently used often act on the edge of their load capability limits, for which reason high capital expenditure on new tester equipment is incurred anew practically for every new memory generation.

Moreover, in view of the constant risk of possible overloading of the tester hardware and the resultant measurement inaccuracies, yield losses increasingly have to be accepted in the production phase.

On account of the reciprocal relationship between the data rate and the measurement accuracy, with the aid of conventional test concepts, even in the foreseeable future, realistic test conditions are virtually or completely impossible without particularly complex tester hardware. Rather, against the background of continuously rising data rates of modern memory modules, there is a growing need for new test concepts for solving the problems presented here.

Published, Non-Prosecuted German Patent Application DE 100 34 897 A1, corresponding to U.S. Patent Application Publication No. 2002012286 A1 discloses a test method and a test apparatus in which test signals with high frequencies can be generated by a special upstream circuit.

SUMMARY OF THE INVENTION

It is accordingly an object of the invention to provide a test method and a test apparatus for an electronic module that overcomes the above-mentioned disadvantages of the prior art devices of this general type, which has a high reliability independent of the data rate of the electronic module. It is a further object of the invention to provide a test apparatus which has a reliable high-speed operating mode for carrying out functional tests.

With the foregoing and other objects in view there is provided, in accordance with the invention, a test method for testing an electronic module having a memory cell device. The method includes the steps of: a) writing an information item to the memory cell device with a first clock frequency; b) reading-out the information item from the memory cell device with a second clock frequency and writing-back the information item reflected at a reflection point to the memory cell device with the second clock frequency resulting in a reflected information item; and c) reading-out the reflected information item from the memory cell device at the first clock frequency.

The test method according to the invention provides for data to be written to the memory cell device of an electronic module by a test unit with a first clock frequency. The data is subsequently to be read out again with a second clock frequency from the memory cell device of the electronic module onto a line, where the data are reflected at a reflection point generated on the line and are then written to the memory cell device again with the second clock frequency. Finally, the data are read out from the memory cell device again with the first clock frequency by the test unit and evaluated. By virtue of the fact that a reflection point is generated on the data line for the purpose of reading from and rewriting to the memory cell device, the internal reading and writing operation can take place at a different speed than the external writing and reading operation by the test unit. As a result of this, the data rate applied to the electronic module becomes completely independent of the hardware of the test unit.

In one advantageous embodiment of the invention, it is provided that the second clock frequency is higher than the first clock frequency. As a result of this, even fast electronic modules can be tested with the aid of a slow test unit under real conditions.

A further advantageous embodiment of the invention consists in the value of the information item that is read out internally from the memory cell device being altered for the rewriting process. As a result of this, it is possible at the same time to assess the behavior of the memory cells of the memory cell device when storing different information values.

Furthermore, it is advantageous for an information item read out from a memory cell to be written back, after the reflection, to a further memory cell of the memory cell device. As a result of this, it is possible to assess the behavior of the memory cells when storing different information values.

Furthermore, it is advantageous to change a value of the information item read out before being written back to the memory cell device during step b).

Furthermore, it is advantageous to provide an increase in the non-reactive resistance at the defined location on the data line. This makes it possible to generate a reflection point at which electrical signals read out on the corresponding line are reflected.

A further advantageous embodiment of the invention consists in the reflection point being generated by mechanical separation of a first part from a second part of the corresponding line. As a result of this, a high-resistance reflection point can be generated particularly simply, e.g. with the aid of a relay.

It is furthermore advantageous to generate the reflection point by electrical decoupling of the first part from the second part of the line. In the case of this solution, the reflection point can be realized particularly simply by a circuit. This has the advantage that no mechanical contact-making problems occur in this case. What is more, particularly high switching speeds can be achieved when a transistor is used as a switch.

In one advantageous embodiment of the invention, it is provided that, at a defined location of a synchronization line serving for the temporal coordination of the data read out from the memory module, a reflection point is generated in order to send the memory module signals emitted via the synchronization line to the memory again in a reflected fashion. This makes it possible to achieve, in a particularly simple manner, a synchronization of the reflected data signals when writing to the memory cells.

With the foregoing and other objects in view there is provided, in accordance with the invention, a test apparatus for an electronic module having a memory cell device. The test apparatus contains a test unit having a clock unit for controlling a clock frequency of the electronic module. The test unit has a write/read device in order, in a first operating mode, to write information items to the memory cell device at a first clock frequency and to read the information items out again from the memory cell device. The clock unit further operates the electronic module in a second operating mode at a second clock frequency. A line is connected to the test unit. A device for generating a reflection point at a defined location of the line is disposed in the line. The reflection point being suitable, in the second operating mode, for reflecting an information item read out from the memory cell device onto the line and for writing the information item back to the memory cell device at the second clock frequency.

Other features which are considered as characteristic for the invention are set forth in the appended claims.

Although the invention is illustrated and described herein as embodied in a test method and a test apparatus for an electronic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a flow diagram of the method for carrying out a writing/reading test according to the invention.

DESCRIPTION OF THE PREFERRED EMBODIMENTS

Figure 1:
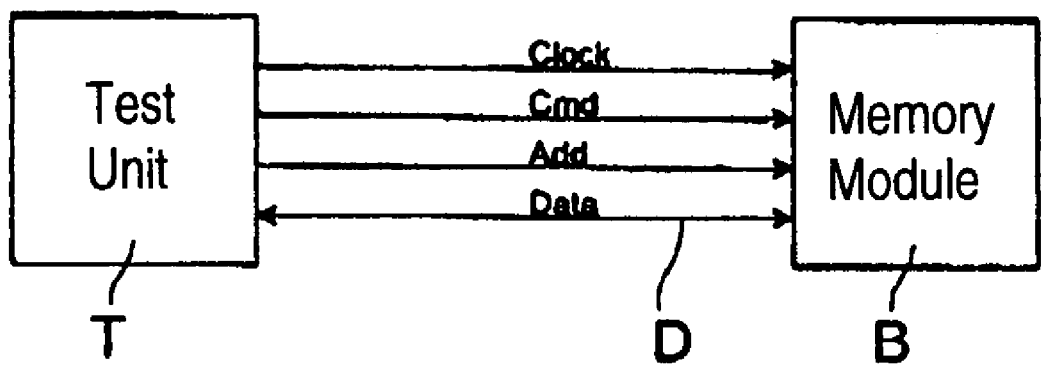
FIG. 1 is a block diagram of an apparatus for the characterization of memory modules according to the invention.

Referring now to the figures of the drawing in detail and first, particularly, to FIG. 1 thereof, there is shown diagrammatically the construction of a conventional test apparatus for characterizing electronic modules. The performance of a writing and reading test of a memory module B being provided, in particular, in the exemplary embodiment illustrated here. In this case, a test unit T is connected to the memory module B, having a multiplicity of memory cells M1, M2, via a plurality of lines, which are symbolically represented by four lines Clock, Cmd, Add, Data. Via the bidirectional data lines D, the test unit T writes data to the memory cells M1, M2 and reads the data out again from the memory cells M1, M2. This is indicated in FIG. 1 by the two arrows at the end of the data line D.

The speed at which the data are written and read out again is prescribed by the test unit T. For this purpose, the test unit T sends clock signals to the memory module B via the clock line Clock.

The memory module B is controlled with the aid of control commands that the test unit T sends to the memory module B via the control lines Cmd. Depending on the respective control command, the memory module B then executes corresponding work operations, such as e.g. writing of information items to the memory cells M1, M2.

The addressing of the data sent to the memory module takes place by address signals that the test unit T sends via the address lines Add to an addressing unit of the memory module B at the same time as the data signals. As a result of this, individual memory cells M1, M2 can be tested in a targeted manner.

An enormously high operating clock is required, in particular, for the simulation of a real writing/reading operation of the memory cells M1, M2 of the memory module B. However, the resultant data rates often overtax the hardware of the test unit T, especially as modern memory modules B operate by the so-called double data rate method, which allows a data rate twice as high as that of conventional memory modules, and because the test unit T has to have a sampling rate that is at least twice as high as the data rate, for a correct reconstruction of the data signals on the basis of the sampling theorem.

If the data rate is increased above a limit inherent to the test unit T, then the risk of the test unit T being overloaded and the writing/reading test no longer being carried out correctly rises in the case of the conventional test apparatus. On account of the latent risk of overloading of the test unit T, the writing/reading test of the fast memory module B is often not effected at its maximum data rate.

Figure 2A:
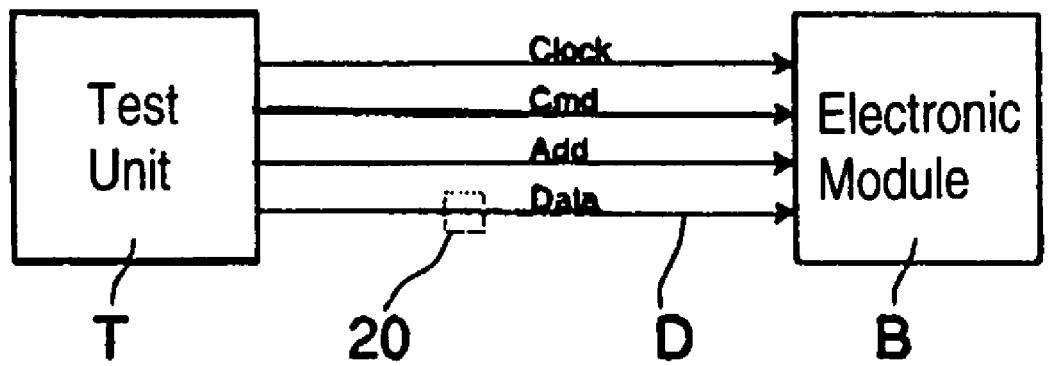
FIGS. 2A–2C are block diagrams of a method for carrying out a writing/reading test according to the invention.
Figure 2B:
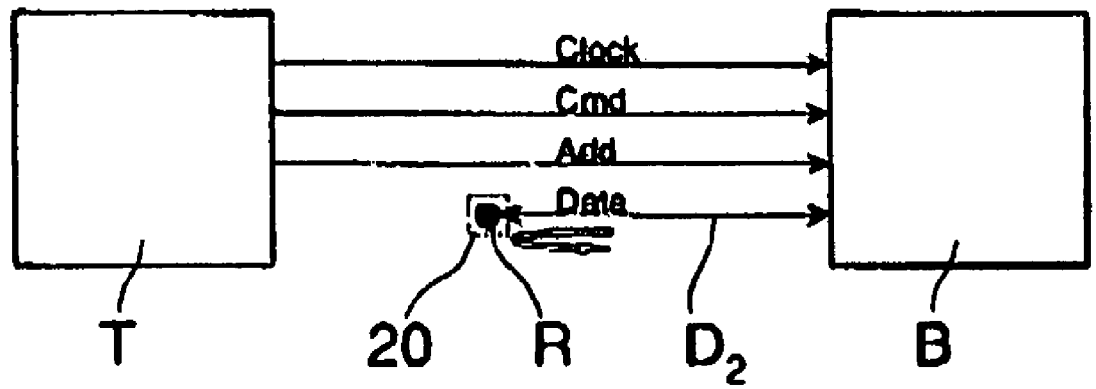
Figure 2C:
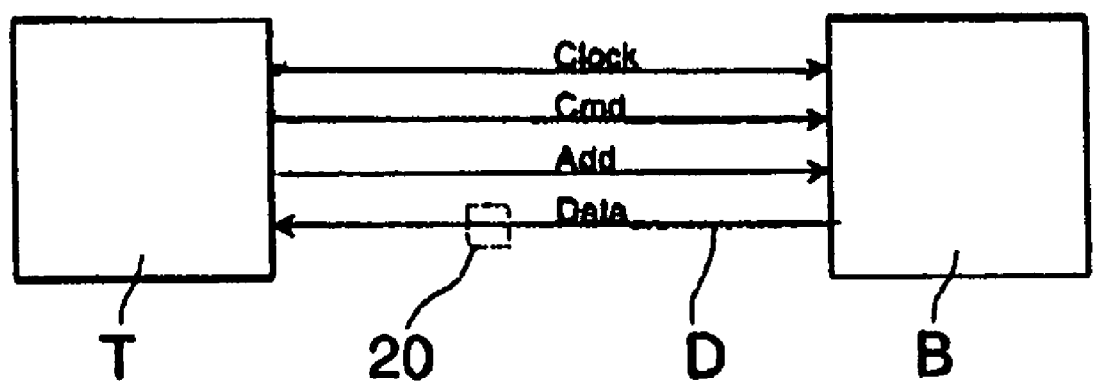

In FIGS. 2A to 2C, the method according to the invention is explained in more detail using an exemplary embodiment. In this case, FIGS. 2A to 2C diagrammatically show the construction of a test apparatus according to the invention for the characterization of electronic modules, in particular of memory modules. In this case, the test unit T is connected to an electronic module such as the memory module B via the lines Clock, Cmd, Add, Data analogously to FIG. 1. The test unit T likewise controls an operating clock of the electronic module B by clock signals on the clock line Clock.

In this case, the electronic module B is controlled by the control commands sent via the control lines Cmd by the test unit T and executes them in the operating clock prescribed by the test unit T.

Via the data lines, which are represented here by a single line D analogously to FIG. 1, data are written or read out to or from the memory cells M1, M2 of the electronic module B by the test unit T.

In contrast to FIG. 1, the test apparatus of FIGS. 2A to 2C has a device 20 for generating reflection points R at defined locations of the data lines D. In this case, the reflection points R may be configured as an open end of the respective data line D, at which the non-reactive resistance of the respective data line D abruptly increases. In this case, the device 20 may have e.g. a relay for mechanically separating a first part $D_1$ from a second part $D_2$ of each data line D or a circuit device, such as e.g. a transistor for electrically decoupling the two parts $D_1$, $D_2$ of the data line D. In this case, in the sense of the invention, it is also possible to provide further methods which are suitable for generating the reflection point R on the data line D.

The device 20 shown in FIG. 2A is formed outside the electronic module B. However, it is equally possible for the device 20 also to be disposed, in particular as a circuitry realization, in the electronic module B itself.

In a first step of the method according to the invention, data are written to the memory cells M1, M2 of the electronic module B by the test unit T. For this purpose, as indicated by an arrow in FIG. 2A, the test unit T sends data with a first clock frequency CLK1 via the data lines D to the electronic module B. In this case, the first clock frequency CLK1 is prescribed to the electronic module B by the test unit T by a clock signal on the clock line Clock. In this case, a low clock frequency is preferably provided, at which the test unit T is not overloaded with the data rate subsequently arising.

In the electronic module B, a write command from the test unit T received via the control lines Cmd controls the writing of the incoming data to the memory cells M1, M2. In this case, the addressing of the received data takes place with the aid of address information sent to the electronic module B by the test unit T via the address lines Add in parallel with the data.

After the data have been written to the memory cells M1, M2, the clock frequency present at the electronic module B is altered. In this case, a second clock frequency CLK2 corresponding to the maximum operating frequency of the electronic module B is preferably chosen.

In order to carry out a writing/reading test of the memory cell M1, M2 with the second clock frequency CLK2, first reflection points R are generated at defined locations of the data lines D. For this purpose, as shown in FIG. 2B, the device 20 preferably separates the first part $D_1$ from the second part $D_2$ of each data line D, thereby producing the reflection point R with an abruptly rising non-reactive resistance of the respective data line D.

Afterward, the test unit T communicates a read command to the electronic module B via the control lines Cmd, whereupon the information units stored in the memory cells M1, M2 are read out onto the data lines D. Simultaneously with the data, the electronic module B also emits synchronization signals on synchronization lines DQS.

The data signals running along the second part $D_2$ of each data line D are reflected at the reflection point R of the corresponding data line D and run back to a signal input of the electronic module B, which is indicated in FIG. 2B with the aid of an arrow that changes its direction. In order to achieve a synchronization of the reflected data signals, provision is preferably made for the synchronization signals emitted with the data to be reflected, for their part, at a reflection point and to be sent back to the input of the electronic module B. For this purpose, analogously to the data lines D, the device 20 also generates reflection points at defined locations of the synchronization lines DQS.

In order to read in the data and synchronization signals, the test unit T once again sends write commands via the control lines Cmd and address information via the address lines Add to the electronic module B. By coordinating the position of the reflection points R on the data and synchronization lines D, DQS, the control and address signals on the lines Cmd, Add can be synchronized with the reflected data and synchronization signals in a particularly simple manner, thereby achieving a correct reading-in of the reflected data into the memory cells M1, M2.

After the memory cells M1, M2 have been written to again, the reflection points R on the data and synchronization lines are eliminated again by the unit 20, so that the electronic module B can send data and synchronization signals unimpeded to the test unit T.

Afterward, the clock frequency of the electronic module B is altered again. In this case, the first clock frequency CLK1 is preferably chosen again, at which the test unit T can reliably manage the data rates subsequently arising.

Then, as shown in FIG. 2C, the reflected data are read out again by the test unit T. For this purpose, the test unit T communicates a read command to the electronic module B via the control lines Cmd. The electronic module B thereupon reads out the contents of the memory cells M1, M2 and forwards them to the test unit T via the data lines D.

The test unit T finally receives the data and evaluates them in order to assess the writing and reading behavior of the electronic module B.

FIG. 3 shows a flow diagram of a preferred embodiment of the method according to the invention for the characterization of memory modules. In this case, a writing/reading test of memory cells M1, M2 of a memory module B is carried out at the highest possible data speed. In this case, the test unit T (designated as tester in FIG. 3) first applies a first clock frequency CLK1 (here designated as low speed) to the connected memory module B. In this case, the first clock frequency CLK1 is preferably chosen to be low, so that the test unit T can always reliably write, read and evaluate the resultant data rates.

In a first step 100, the test unit T writes data to the memory cells M1, M2 (designated as memory in FIG. 3) via the data lines D with the first clock frequency CLK1.

Afterward, the data lines D are separated between the test unit T and the memory cells M1, M2 (step 110), a reflection point R being generated at a defined location of each data line D, incoming data signals being reflected at the reflection point. In this case, the reflection point R preferably constitutes an abrupt rise in the non-reactive resistance of the data line D that the electrical data signals can pass through only with difficulty or not at all.

In the subsequent method step, the test unit T applies a second clock frequency CLK2 (here designated as high speed) to the memory module B. In order to test the memory module B with the highest possible data speed, a high clock frequency is preferably chosen.

Afterward, the data are read out again with the second clock frequency CLK2 from the memory cells M1, M2 of the memory module B onto the data lines D, step 120. At the reflection points R of the data lines D, the data signals are reflected and are written back to the memory cells M1, M2 again with the second clock frequency CLK2, steps 130 and 140. In order to test the behavior of the memory cells M1, M2 when storing different information values, the values of the information units can be altered before being written back to the memory cells M1, M2. In the case of a DRAM memory, in which the two binary values 0 and 1 are assigned to two complementary charge states, the data may in this case be written back to the memory cells M1, M2 again in inverse fashion.

After the reflected data have been written to the memory cells M1, M2, preferably the first clock frequency CLK1 is again applied to the memory module B.

Afterward, the data are read out again with the first clock frequency CLK1 from the memory cells M1, M2 of the memory module B by the test unit T via the data lines D, step 150.

Finally, the received data are evaluated by the test unit T in order to be able to assess the writing and reading behavior of the memory module.

Figure 4:
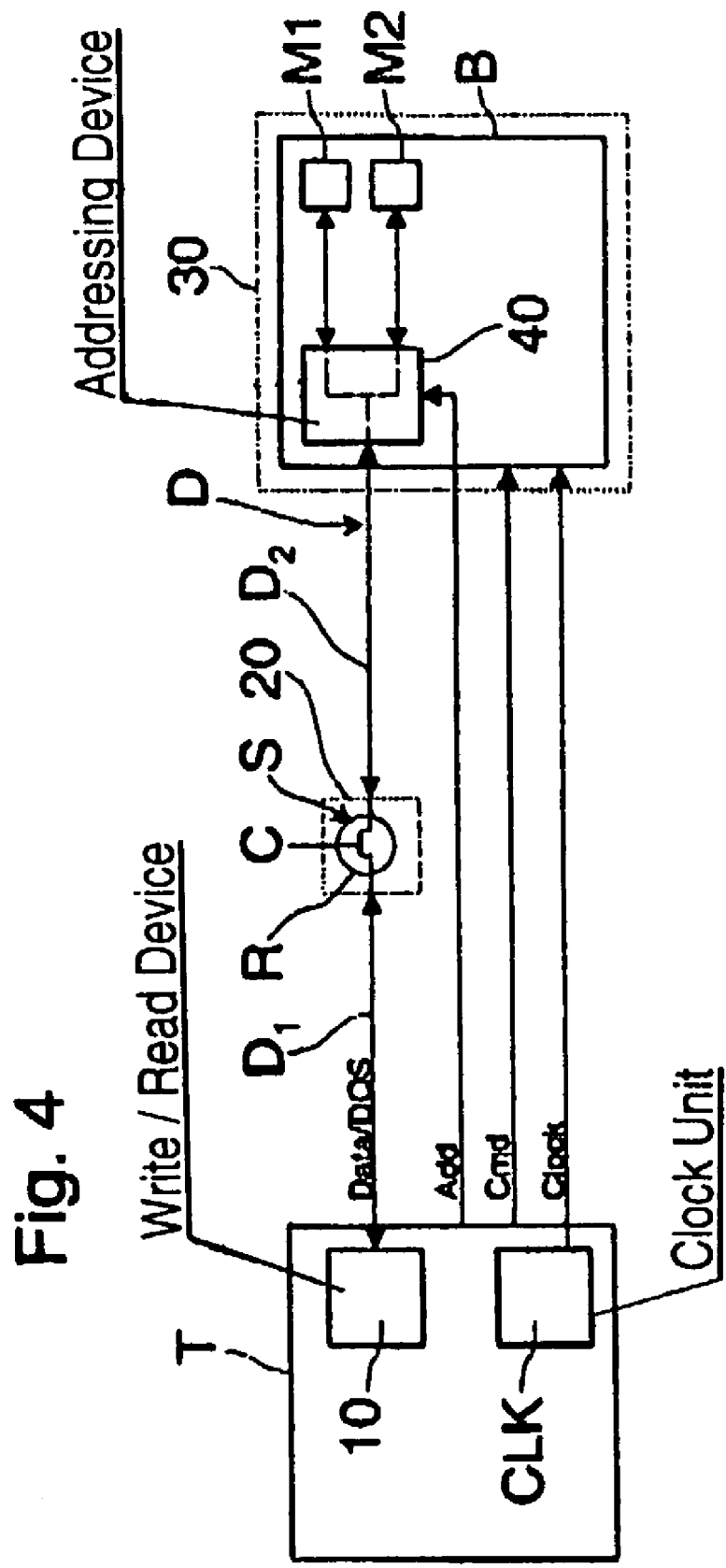
FIG. 4 is a block diagram of an apparatus for carrying out a writing/reading test according to the invention.

FIG. 4 diagrammatically shows a test apparatus according to the invention for carrying out writing/reading tests in electronic modules, in particular memory modules. In this case, the test apparatus contains a receptacle device 30 for receiving at least one memory module B and also the test unit T, which is connected via the data, address, control and clock lines to the memory module B disposed in the receptacle device 30. For simplification, only four lines D, Add, Cmd, Clock are depicted. The tested memory module B preferably has a multiplicity of memory cells, only two of the memory cells M1, M2 being illustrated in FIG. 4.

The test unit T contains a clock unit CLK, which prescribes the clock frequency of the memory module B via the clock line Clock. By the clock unit, the operating speed of the memory module B can be determined and its data rate can thus be adapted to the respective requirement.

Furthermore, the test unit T has a write/read device 10 in order to write data to the memory cells M1, M2 of the memory module B and to read the data back again. In this case, an input/output of the device 10 is connected via the data line D to an input/output of an addressing device 40 of the memory module B, which addressing device 40 performs the distribution of the data received via the data line D to the individual memory cells M1, M2 in a manner dependent on address signals received on the address line Add. For this purpose, the address line Add connects an output of the test unit T to an input of the addressing unit 40. The addressing unit 40 in turn is connected to the individual memory cells M1, M2 via separate lines. During the read-out operation, the addressing unit 40 also distributes the data received from the memory cells M1, M2 to the data line D. Furthermore, the addressing unit 40 can be controlled in such a way that the reflected data are written, e.g. by the rotation principle, to different memory cells M1, M2 than the original ones.

The control lines Cmd are used by the test unit T to control the operating sequence of the memory module B. Depending on the control signal, the memory cells M1, M2 of the memory module B are in this case written to or read from.

According to the invention, the test apparatus illustrated in FIG. 4 has the device 20 in order to generate reflection points R on the data lines D. In this case, as shown in FIG. 4, the device 20 preferably has in each case a switching transistor S controlled by a switching signal C. In this case, the switching transistor S serves for generating a high-resistance reflection point R on a defined location of the corresponding data line D, at which reflection point the data read out from the memory cells M1, M2 can be reflected. In this case, the switching transistor S electrically decouples the first part $D_1$ and the second part $D_2$ of the data line D from one another. In this case, the length of the second part $D_2$ of the data line D determines, in particular, the propagation times of the reflected signals. A synchronization of the reflected data signals with the control and address signals of the test device T can therefore be achieved through a suitable choice of the position of the switching transistor S on the data line D.

Furthermore, the test apparatus according to the invention has further synchronization lines DQS, which connect the memory module B to the test unit T. The synchronization lines DQS serve, in particular, for synchronizing the data read out from the memory. According to the invention, it is provided that, analogously to the data lines, the device 20 generates reflection points at defined locations of the synchronization lines DQS. The reflected synchronization signals enable a synchronization of the reflected data signals upon renewed writing to the memory cells M1, M2 of the memory module B.

In the exemplary embodiments illustrated above, the data signals are read out onto the data lines D having the reflection points R. However, in the sense of the invention, it is also possible to provide for the data to be read out onto other line structures that have a reflection point.

Furthermore, the embodiments described above describe a data transmission with the aid of electrical signals. It is likewise envisaged, however, for the reflection method in the sense of the invention also to be applied to a different type of data transmission, such as e.g. optical data transmission.

The features of the invention disclosed in the above description, the claims and the drawings may be essential both individually and in any desired combination for the realization of the invention in its various embodiments.

We claim:

1. A test method for testing an electronic module having a memory cell device, which comprises the steps of:
   a) writing an information item to the memory cell device by a test unit with a first clock frequency;
   b) reading-out the information item from the memory cell device with a second clock frequency onto a line and writing-back the information item reflected at a reflection point generated on the line to the memory cell device with the second clock frequency resulting in a reflected information item; and
   c) reading-out the reflected information item from the memory cell device by a test unit at the first clock frequency.

2. The test method according to claim 1, which further comprises selling the second clock frequency higher than the first clock frequency.

3. The test method according to claim 1, which further comprises performing the following steps during step b):
   generating the reflection point at a defined location of a line connecting the test unit to the memory cell device;
   reading-out the information item from the memory cell device onto the line at the second clock frequency and writing-back the reflected information item at the reflection point to the memory cell device at the second clock frequency; and
   eliminating the reflection point on the line.

4. The test method according to claim 1, which further comprises changing a value of the information item read out before being written back to the memory cell device during step b).

5. The test method according to claim 1, which further comprises:
   writing back the information item written in a first memory cell of the memory cell device, after the reflection, to a second memory cell of the memory cell device.

6. The test method according to claim 1, which further comprises generating the reflection point by increasing a non-reactive resistance at a defined location of a line.

7. The test method according to claim 6, which further comprises increasing the non-reactive resistance at the defined location of the line by generating an open end of the line.

8. The test method according to claim 7, which further comprises generating the open end of the line by one of mechanical separation and electrical decoupling of a first part of the line from a second part of the line.

9. The test method according to claim 1, which further comprises:
   using the electronic module for transmitting a synchronization signal for synchronization of the information item read out on a synchronization line, the synchronization signal, analogously to the information item, is reflected at a further reflection point disposed on a defined location of the synchronization line and is fed to the electronic module again for the synchronization of a process of reading in the reflected information item.

10. A test apparatus for an electronic module having a memory cell device, the test apparatus comprising:
   a test unit having a clock unit for controlling a clock frequency of the electronic module, said test unit having a write/read device in order, in a first operating mode, to write information items to the memory cell device at a first clock frequency and to read the information items out again from the memory cell device, said clock unit further operating the electronic module in a second operating mode at a second clock frequency;
   a line connected to said test unit; and
   a device for generating a reflection point at a defined location of said line and disposed in said line, said reflection point being suitable, in the second operating mode, for reflecting an information item read out from the memory cell device onto said line and for writing the information item back to the memory cell device at the second clock frequency.

11. The test apparatus according to claim 10, wherein the second clock frequency is higher than the first clock frequency.

12. The test apparatus according to claim 10, wherein said line is a data line connecting the memory cell device to said test unit.

13. The test apparatus according to claim 12, further comprising a further line connected to said device, said device configured to generate a further reflection point on said further line, said further reflection point on said further line being suitable for reflecting a synchronization signal provided for synchronization of the information items read out from the memory cell device and for sending the synchronization signal to the electronic module for the synchronization of reflected information items.

14. The test apparatus according to claim 13, wherein said further line is a synchronization line connecting the electronic module to said test unit.

15. The test apparatus according to claim 14, wherein said device for generating reflection points on said line and said further line is a relay mechanically separating a first part from a second part of said line and said further line.

16. The test apparatus according to claim 14, wherein said device for generating said reflection point on said line and said further line is an electronic circuit electrically decoupling a first part of said line from a second part of said line and electrically decoupling a first part of said further line from a second part of said further line.

17. A test method for testing an electronic module having a memory cell device, which comprises the steps of:
   writing an information item with a test unit to the memory cell device at a first clock frequency;
   reading out the information item with the test unit from the memory cell device onto the line at the second clock frequency, reflecting the information item at the reflection point, and writing back the reflected information item to the memory cell device at the second clock frequency resulting in a reflected information item;
   eliminating the reflection point on the line; and
   reading out the reflected information item from the memory cell device at the first clock frequency.

18. A test method for testing an electronic module having a memory cell device, which comprises the steps of:
   writing an information item to the memory cell device by a test unit with a first clock frequency;
   generating a reflection point by increasing a non-reactive resistance at a defined location of a line;
   reading out the information item from the memory cell device with a second clock frequency and writing back the information item reflected at the reflection point to the memory cell device with the second clock frequency, resulting in a reflected information item; and
   reading out the reflected information item from the memory cell device by the test unit at the first clock frequency.

19. The test method according to claim 18, which further comprises increasing the non-reactive resistance at the defined location of the line by generating an open end of the line.

20. The test method according to claim 19, which further comprises generating the open end of the line by one of mechanical separation and electrical decoupling of a first part of the line from a second part of the line.

* * * * *